(12) United States Patent
Adachi et al.

(10) Patent No.: US 6,669,808 B2
(45) Date of Patent: Dec. 30, 2003

(54) SUBSTRATE PROCESSING APPARATUS AND SUBSTRATE PROCESSING METHOD

(75) Inventors: Hideki Adachi, Kyoto (JP); Katsuhiko Miya, Kyoto (JP); Akira Izumi, Kyoto (JP); Itsuki Kajino, Kyoto (JP)

(73) Assignee: Dainippon Screen Mfg. Co., Ltd. (JP)

(*) Notice: Subject to any disclaimer, the term of this patent is extended or adjusted under 35 U.S.C. 154(b) by 0 days.

(21) Appl. No.: 10/102,391

(22) Filed: Mar. 18, 2002

(65) Prior Publication Data
US 2002/0134512 A1 Sep. 26, 2002

(30) Foreign Application Priority Data

Mar. 22, 2001 (JP) .................. 2001-082937
Aug. 14, 2001 (JP) .................. 2001-245984
Aug. 14, 2001 (JP) .................. 2001-245985

(51) Int. Cl.[7] ............ B08B 5/04; H01L 21/306; H01L 21/02
(52) U.S. Cl. .................. 156/345.11; 134/33
(58) Field of Search .............. 156/345.11, 345.23, 156/345.55, 345.12; 427/336; 216/90; 118/56, 52; 134/33, 34

(56) References Cited

U.S. PATENT DOCUMENTS

| 3,523,706 A | | 8/1970 | Logue | |
| 4,968,375 A | * | 11/1990 | Sato et al. | 156/345.23 |
| 5,608,943 A | * | 3/1997 | Konishi et al. | 15/302 |
| 5,879,576 A | * | 3/1999 | Wada et al. | 216/91 |
| 5,896,877 A | | 4/1999 | Pirker | |

FOREIGN PATENT DOCUMENTS

| JP | 4129208 | * | 4/1992 |
| JP | 10-237678 | | 9/1998 |
| JP | 11-176795 | | 7/1999 |

* cited by examiner

Primary Examiner—Gregory Mills
Assistant Examiner—Sylvia R. MacArthur
(74) Attorney, Agent, or Firm—Ostrolenk, Faber, Gerb & Soffen, LLP

(57) ABSTRACT

A support member of a rotary base member engages with a substrate for preventing the substrate from horizontal movement and rotation with respect to the rotary base member while allowing vertical movement of the substrate, and a proximity suction plate is provided above the rotary base member so that the lower surface thereof is formed on a plane on the rotary base member parallel to the substrate for downwardly and outwardly injecting gas toward the overall upper surface of the substrate and sucking the substrate in a proximity state by Bernoulli effect. It is possible to provide an apparatus capable of reliably preventing mist of a processing solution or the processing solution from reaching the upper surface of the substrate when rotating the substrate and supplying the processing solution to the lower surface for processing the substrate.

15 Claims, 12 Drawing Sheets

F I G . 1 4
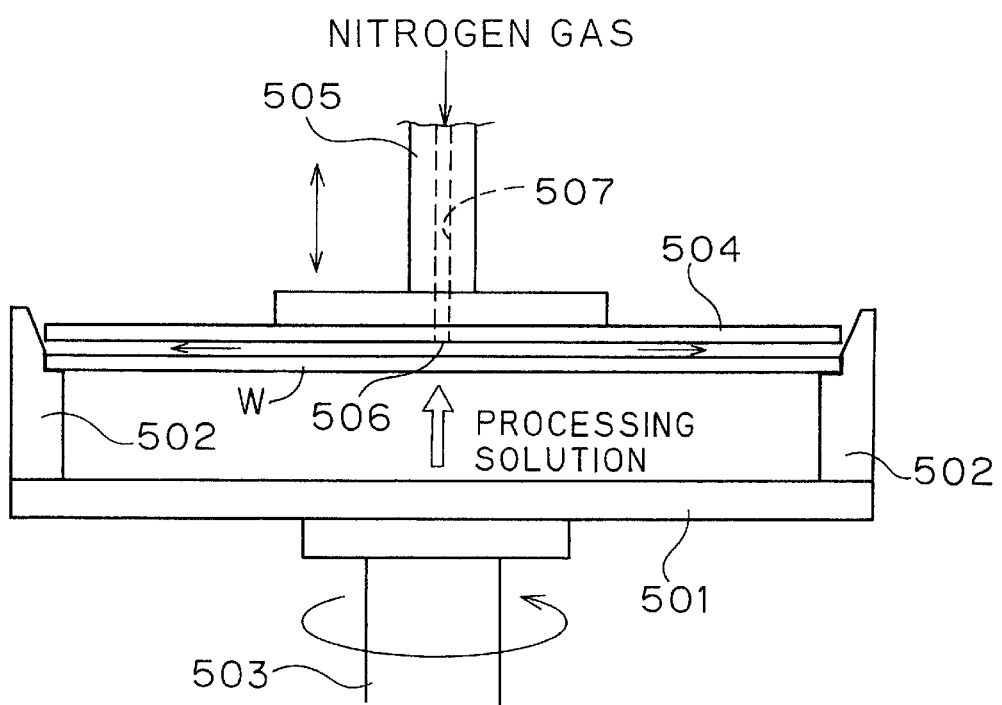

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method horizontally holding a substrate such as a semiconductor wafer, a glass substrate for a liquid crystal display, a glass substrate for a plasma display, a substrate for a photomask or a substrate for an optical disk (hereinafter simply referred to as a "substrate") and rotating the same about a vertical axis for supplying a processing solution such as an etching solution, a developer or a detergent to the lower surface of the substrate and processing the substrate.

2. Description of the Background Art

When a processing solution such as an etching solution is supplied to the lower surface of a substrate such as a semiconductor wafer horizontally rotated about a vertical axis, mist of the processing solution scattered during the processing may reach the upper surface of the substrate to adhere thereto or the processing solution supplied to the lower surface of the substrate may reach the upper surface of the substrate from the peripheral edge thereof. In order to solve this problem, generally employed is a substrate processing apparatus approaching a blocking member to the upper surface of the substrate for defining a narrow space between the upper surface of the substrate and the blocking member and introducing inert gas such as nitrogen gas into the space thereby preventing the mist of the processing solution or the processing solution from reaching the upper surface of the substrate.

FIG. 14 is a model diagram schematically showing the structure of a principal part of an exemplary conventional substrate processing apparatus having the aforementioned structure. A substrate W is positioned by a plurality of, e.g., three support pins 502 provided on a rotary base member 501, to be horizontally supported. The rotary base member 501, fixed to the upper end of a rotary spindle 503 rotatably supported and rotated about a vertical axis by a motor (not shown), is rotated while holding the substrate W. A blocking member 504 consisting of a circular plate equivalent in size to the substrate W is arranged above the rotary base member 501, mounted on a suspension arm 505 and horizontally held. The suspension arm 505 is vertically movably supported to be capable of approaching the blocking member 504 to the substrate W and upwardly separating the former from the latter. A gas outlet 506 is provided on the central portion of the blocking member 504 for injecting inert gas such as nitrogen gas toward the upper surface of the substrate W. The suspension arm 505 is formed on its axial portion with a gas introduction passage 507, communicating with the gas outlet 506, connected to a gas supply pipe (not shown).

A processing solution nozzle (not shown) is arranged under the rotary base member 501 for supplying a processing solution such as an etching solution, a developer or a detergent to the lower surface of the substrate W in response to the contents of processing. A cup is vertically movably arranged around the rotary base member 501 for preventing the processing solution from scattering, and a discharge/exhaust pipe is provided on the bottom portion of this cup for discharging the processing solution recovered in the cup from the substrate processing apparatus and exhausting the cup.

In order to process the substrate W in the substrate processing apparatus having the aforementioned structure, the blocking member 504 is approached to the substrate W supported by the support pins 502 provided on the rotary base member 501 for rotating the substrate W and supplying the processing solution to the lower surface of the substrate W. At this time, the inert gas is injected toward the upper surface of the substrate W from the gas outlet 506 of the blocking member 504 to be introduced into and purge the space between the upper surface of the substrate W and the blocking member 504. The inert gas introduced into the space between the substrate W and the blocking member 504 flows toward the peripheral edge of the substrate W, and is injected outward from the peripheral edge of the substrate W. Therefore, mist of the processing solution scattered from the peripheral edge of the substrate W is forced back by the flow of the inert gas outwardly injected from the peripheral edge of the substrate W not to penetrate into the space between the substrate W and the blocking member 504, and the processing solution supplied to the lower surface of the substrate W is prevented by the flow of the inert gas from reaching the upper surface of the substrate W from the peripheral edge of the substrate W.

In the aforementioned substrate processing apparatus approaching the blocking member 504 to the upper surface of the substrate W for purging the space between the substrate W and the blocking member 504 by introducing the nitrogen gas, the blocking member 504 must be approached to the upper surface of the substrate W as close as possible in order to effectively prevent the scattered mist and the processing solution from reaching the upper surface of the substrate W. However, the distance capable of approaching the blocking member 504 to the upper surface of the substrate W without coming into contact with the rotated substrate W is limited due to mechanical accuracy of the blocking member 504. In the structure approaching the blocking member 504 to the upper surface of the substrate W, therefore, the mist of the processing solution or the processing solution cannot necessarily be sufficiently prevented from reaching the upper surface of the substrate W.

SUMMARY OF THE INVENTION

The present invention is directed to a substrate processing apparatus supporting a substrate by Bernoulli effect and supplying a processing solution to the lower surface of the substrate thereby processing the substrate.

The substrate processing apparatus according to the present invention, supplying a processing solution to a substrate for performing prescribed processing, comprises a proximity suction member downwardly and outwardly injecting gas toward the overall peripheral edge of the upper surface of the substrate for sucking the substrate in a proximity state by Bernoulli effect, a rotating/driving part rotating the substrate sucked by the proximity suction member in the proximity state, and a processing solution supply part supplying the processing solution to a lower surface of the substrate rotated in the state sucked by the proximity suction member in the proximity state.

The proximity suction member sucks the substrate in the proximity state due to the Bernoulli effect for rotating the substrate, supplying the processing solution to the lower surface of the substrate and processing the substrate, thereby preventing mist of the processing solution scattered from the peripheral edge from reaching the upper surface of the substrate and adhering thereto or preventing the processing solution supplied to the lower surface of the substrate from reaching the upper surface from the peripheral edge of the substrate.

According to a preferred embodiment of the present invention, the proximity suction member comprises a support surface injecting gas from a plurality of holes thereby sucking/supporting the substrate through Bernoulli effect while setting the maximum width of each of the plurality of holes to not more than 2 mm in a section perpendicular to the direction of formation of the holes, and a passage guiding the gas to the plurality of holes.

The substrate can be properly sucked and supported.

According to another preferred embodiment of the present invention, the substrate processing apparatus further comprises a plurality of contact members arranged on the outer periphery of the substrate sucked by the proximity suction member in the proximity state, and the rotating/driving part rotates the plurality of contact members in a plane parallel to a support surface of the proximity suction member injecting the gas thereby sucking the substrate through Bernoulli effect, for at least partially bringing the plurality of contact members into contact with the substrate substantially in the peripheral direction thereof and rotating the substrate.

The substrate and the proximity suction member can be approached to each other through a simple structure for properly controlling the atmosphere on the upper surface of the substrate and preventing the processing solution scattered from the substrate from adhering to the upper surface after being splashed.

The present invention is also directed to a substrate processing method supporting a substrate by Bernoulli effect and supplying a processing solution to the lower surface of the substrate thereby processing the substrate.

Accordingly, an object of the present invention is to reliably prevent mist of a processing solution or the processing solution from reaching the upper surface of a substrate when rotating the substrate and supplying the processing solution to the lower surface of the substrate for processing the substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a model diagram schematically showing an exemplary structure of a principal part of a conventional substrate processing apparatus.

DESCRIPTION OF THE PREFERRED EMBODIMENTS

<First Embodiment>

A first preferred embodiment of the present invention is now described with reference to FIGS. 1 to 3.

Figure 1:
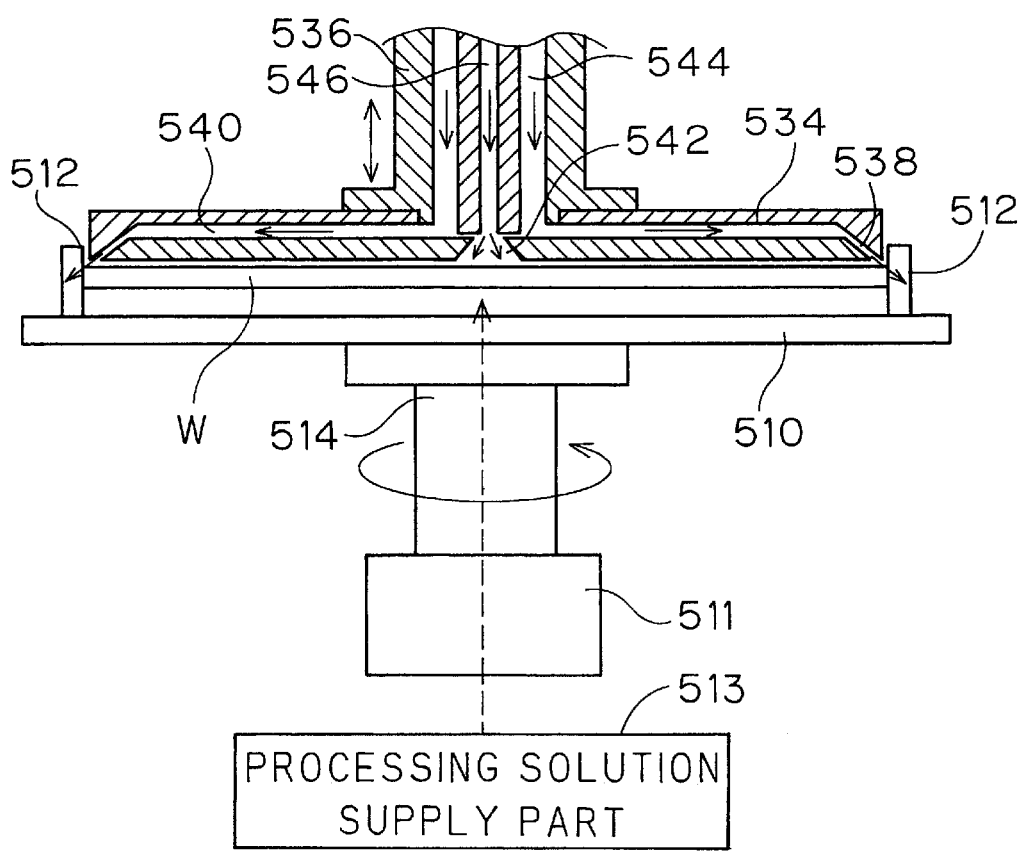
FIG. 1 is a partially fragmented end view schematically showing the structure of a principal part, to which the present invention is applied, of a substrate processing apparatus according to an embodiment of the present invention.

FIG. 1 is a partially fragmented end view schematically showing the structure of a principal part, to which the present invention is applied, of a substrate processing apparatus according to the first embodiment. The basic structure of this substrate processing apparatus is similar to that of the conventional substrate processing apparatus described above with reference to FIG. 14, and hence redundant description is omitted.

This substrate processing apparatus comprises a rotary base member 510 fixed to the upper end of a rotary spindle 514 and horizontally supported. A motor 511 rotates/drives the rotary spindle 514 thereby rotating the rotary base member 510 about a vertical axis. A processing solution supply part 513 is arranged under the rotary base member 510 for supplying a processing solution such as an etching solution, a developer or a detergent to the lower surface of a substrate W in response to the contents of processing. Support members 512 are arranged on a plurality of portions, e.g., three portions, of the upper surface of the rotary base member 510.

Figure 2A:
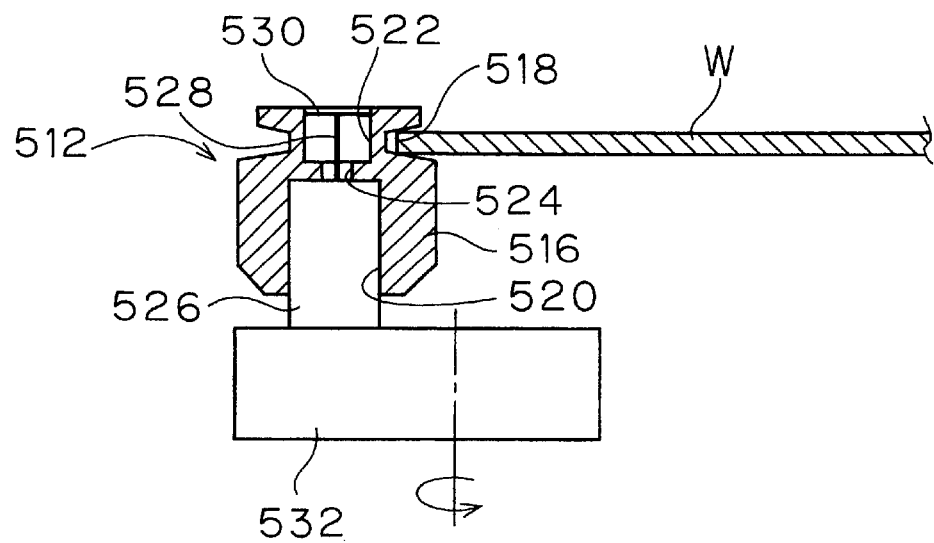
FIGS. 2A and 2B are enlarged partially fragmented sectional views showing an exemplary structure of a support member forming the substrate processing apparatus shown in FIG. 1 with a substrate and a regulation part in states stopped on a stationary position and floating from the stationary position respectively.
Figure 2B:
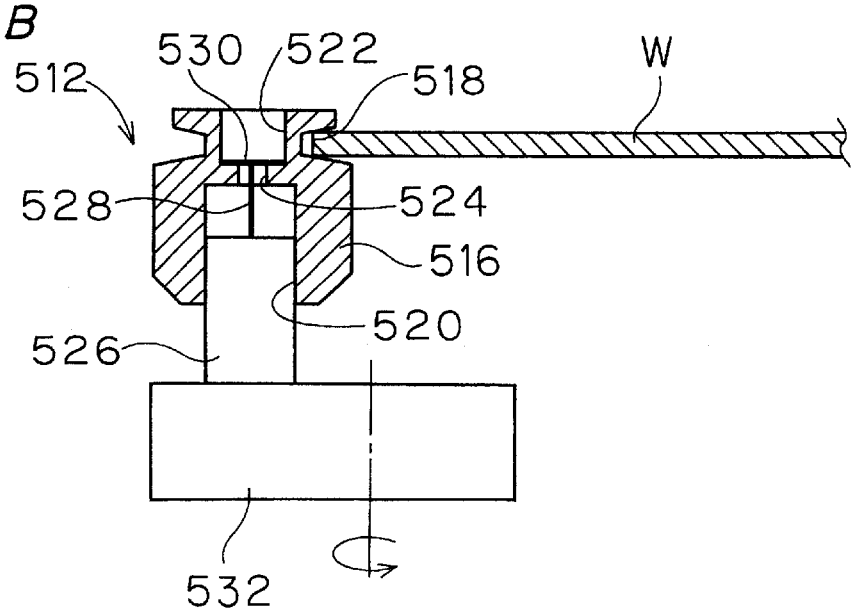

As illustrated in FIGS. 2A and 2B showing enlarged partially fragmented sectional views, each support member 512 is formed by a regulation part 516, provided with an engaging groove 518 for engaging with the peripheral edge of the substrate W on its upper peripheral surface, cylindrically formed over the central portion and the lower end surface, a support pin part 526 slidably engaged in a cylindrical cavity 520 opening on the lower end surface of the regulation part 516 and a bottom plate 532 having the support pin part 526 integrally fixed to its upper surface. An upper hole 522 is formed in the central portion of the upper end surface of the regulation part 516, so that the lower bottom portion of the upper hole 522 and the upper bottom portion of the cylindrical cavity 520 communicate with each other through a communication hole 524 having a smaller diameter than the upper hole 522. A spindle 528 is integrally fixed to the central portion of the upper end surface of the support pin part 526 to vertically project from the upper end surface and extend toward the upper hole 522 through the communication hole 524. A discoidal stopper 530 is perpendicularly fixed to the upper end of the spindle 528, to be capable of relatively vertically moving in the upper hole 522 while bringing the peripheral edge thereof into sliding contact with the inner peripheral surface of the upper hole 522 or approaching the former to the latter. The bottom plate 532 is axially mounted on the upper surface of the rotary base member 510 on a position decentered from the axis of the support pin part 526 to be swingable in a horizontal plane.

In each support member 512 having the aforementioned structure, the engaging groove 518 of the regulation part 516 engages with the peripheral edge of the substrate W thereby regulating horizontal movement of the substrate W for positioning the substrate W, regulating rotation of the substrate W with respect to the rotary base member 510 for positioning the substrate W and regulating rotation of the substrate W with respect to the rotary base member 510 for rotating the former with the latter. The regulation part 516 slidably supported by the support pin parts 526 is vertically movable within an altitudinal range allowing relative movement of the stopper 530 in the upper hole 522. Referring to FIG. 2A, the substrate W and the regulation part 516 are stopped on a stationary position due to the dead weight thereof. Referring to FIG. 2B, the substrate W and the regulation part 516 float from the stationary position with respect to the rotary base member 510 due to upward force acting on the substrate W held by the regulation part 516. When the bottom plate 532 horizontally swings in the horizontal plane, the regulation part 516 supported by the support pin part 526 can be switched with respect to the substrate W (approached to/separated from the peripheral edge of the substrate W).

A circular proximity suction plate 534 substantially identical in size to the substrate W is arranged above the rotary base member 510. The proximity suction plate 534 is mounted on the lower end of a suspension arm 536 to be horizontally held. The suspension arm 536, vertically movably supported by a vertical support mechanism (not shown), can vertically move the proximity suction plate 534 for approaching or separating the proximity suction plate 534 to or from the substrate W placed on the rotary base member 510.

An annular nozzle 538 is provided on the overall lower peripheral edge of the proximity suction plate 534 for downwardly and outwardly injecting inert gas such as nitrogen gas toward the upper surface of the substrate W supported on the rotary base member 510. A gas passage 540 communicating with the annular nozzle 538 is formed in the proximity suction plate 534. A gas outlet 542 is formed on the central portion of the lower surface of the proximity suction plate 534. Gas supply passages 544 and 546 communicating with the gas passage 540 and the gas outlet 542 of the proximity suction plate 534 are axially provided in the suspension arm 536 and connected to a gas supply pipe (not shown) connected to a supply source for the inert gas such as nitrogen gas.

The substrate processing apparatus having the aforementioned structure downwardly moves the proximity suction plate 534 for approaching the same to the substrate W supported by the support members 512 of the rotary base member 510 and downwardly and outwardly injecting the inert gas such as nitrogen gas toward the overall peripheral edge of the upper surface of the substrate W from the annular nozzle 538 of the proximity suction plate 534. Thus, upward force acts on the substrate W due to the Bernoulli's principle for sucking the substrate W to the proximity suction plate 534. The substrate W upwardly moves with the regulation part 516 of each support member 512 as shown in FIG. 2B, so that the proximity suction plate 534 sucks the substrate W approaching to the lower surface of the proximity suction plate 534 at an interval of about 0.1 mm, for example. At this time, the inert gas is injected also toward the central portion of the upper surface of the substrate W from the gas outlet 542 of the proximity suction plate 534, not to upwardly deflect the central portion of the substrate W.

Thus, the substrate W is rotated while the upper surface thereof approaches to the lower surface of the proximity suction plate 534, so that the processing solution supply part 513 supplies the processing solution to the lower surface of the substrate W. Therefore, mist of the processing solution scattered from the peripheral edge of the substrate W is prevented from reaching the upper surface of the substrate W and adhering thereto or the processing solution supplied to the lower surface of the substrate W is prevented from reaching the upper surface of the substrate W from the peripheral edge thereof. The rotary base member 510 atmospherically blocks the lower surface of the substrate W thereby inhibiting the same from coming into direct contact with the outside air.

The proximity suction plate 534 may be rotated with the substrate W, i.e., synchronously or independently rotated, or may suck the rotated substrate W to the lower surface thereof in a state not rotated but fixed. When the proximity suction plate 534 is synchronously rotated with the substrate W, the support members 512 and the proximity suction plate 534 can be prevented from coming into contact with each other during rotation even if the substrate W has a rectangular shape.

Figure 3A:
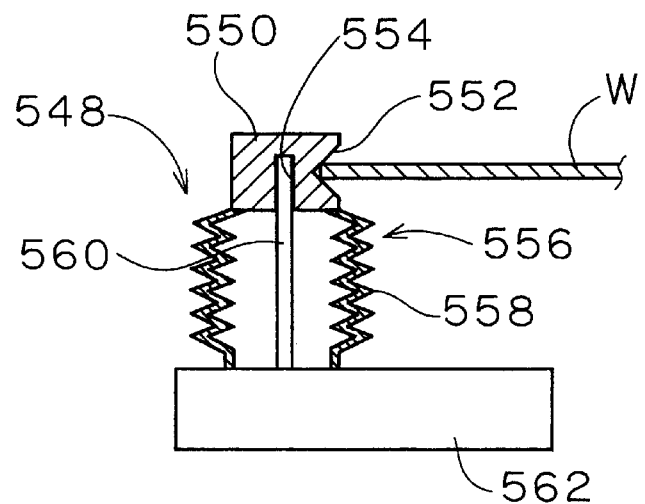
FIGS. 3A and 3B are enlarged partially fragmented sectional views showing another exemplary structure of the support member with a substrate and a regulation part in states stopped on a stationary position and floating from the stationary position respectively.
Figure 3B:
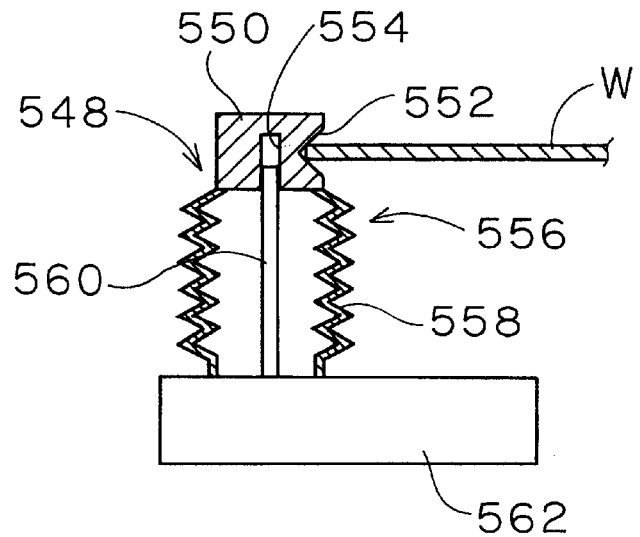

FIGS. 3A and 3B are enlarged partially fragmented sectional view showing another exemplary support member 548. This support member 548 is formed by a regulation part 550 provided with an engaging groove 552 engaging with the peripheral edge of the substrate W, a support part 556 vertically movably supporting the regulation part 550 and a bottom plate 562 having the support part 556 fixed to its upper surface. A guide hole 554 is axially formed on the central portion of the lower surface of the regulation part 550. The support part 556 is formed by a bellows 558 and a guide bar 560 arranged on the core portion of the bellows 558. The guide bar 560 has a lower end fixed to the bottom plate 562 and an upper end slidably engaged in the guide hole 554 of the regulation part 550. The bellows 558 has an upper end fixed to the lower surface of the regulation part 550 and a lower end fixed to the bottom plate 562.

Also in this support member 548, the regulation part 550 and the bottom plate 562 function similarly to the regulation part 516 and the bottom plate 532 of the support member 512 shown in FIGS. 2A and 2B. The bellows 558 expands/contracts following vertical movement of the regulation part 550 guided by the upper portion of the guide bar 560, so that the support part 556 vertically movably supports the regulation part 550. Referring to FIG. 3A, the bellows 558 contracts due to the dead weight of the substrate W and the regulation part 550, for stopping the substrate W and the regulation part 550 on a stationary position. Referring to FIG. 3B, the substrate W and the regulation part 550 float from the stationary position with respect to the rotary base member 510 due to upward force acting on the substrate W held by the regulation part 550. At this time, the bellows 558 expands following upward movement of the regulation part 550.

While the annular nozzle 538 is formed on the peripheral edge of the proximity suction plate 534 for injecting the inert gas toward the upper peripheral edge of the substrate W in the embodiment shown in FIG. 1, the annular nozzle 538 may alternatively be formed on a position closer to the center from the peripheral edge of the proximity suction plate 534, e.g., a position of about half the radius, for injecting the inert gas toward the upper middle portion of the substrate W. While the proximity suction plate 534 is vertically moved to be approached to or separated from the substrate W placed on the rotary base member 510 in the aforementioned embodiment, the proximity suction plate 534 may alternatively be fixed so that the rotary base member 510 is vertically moved.

<Second Embodiment>

Figure 4:
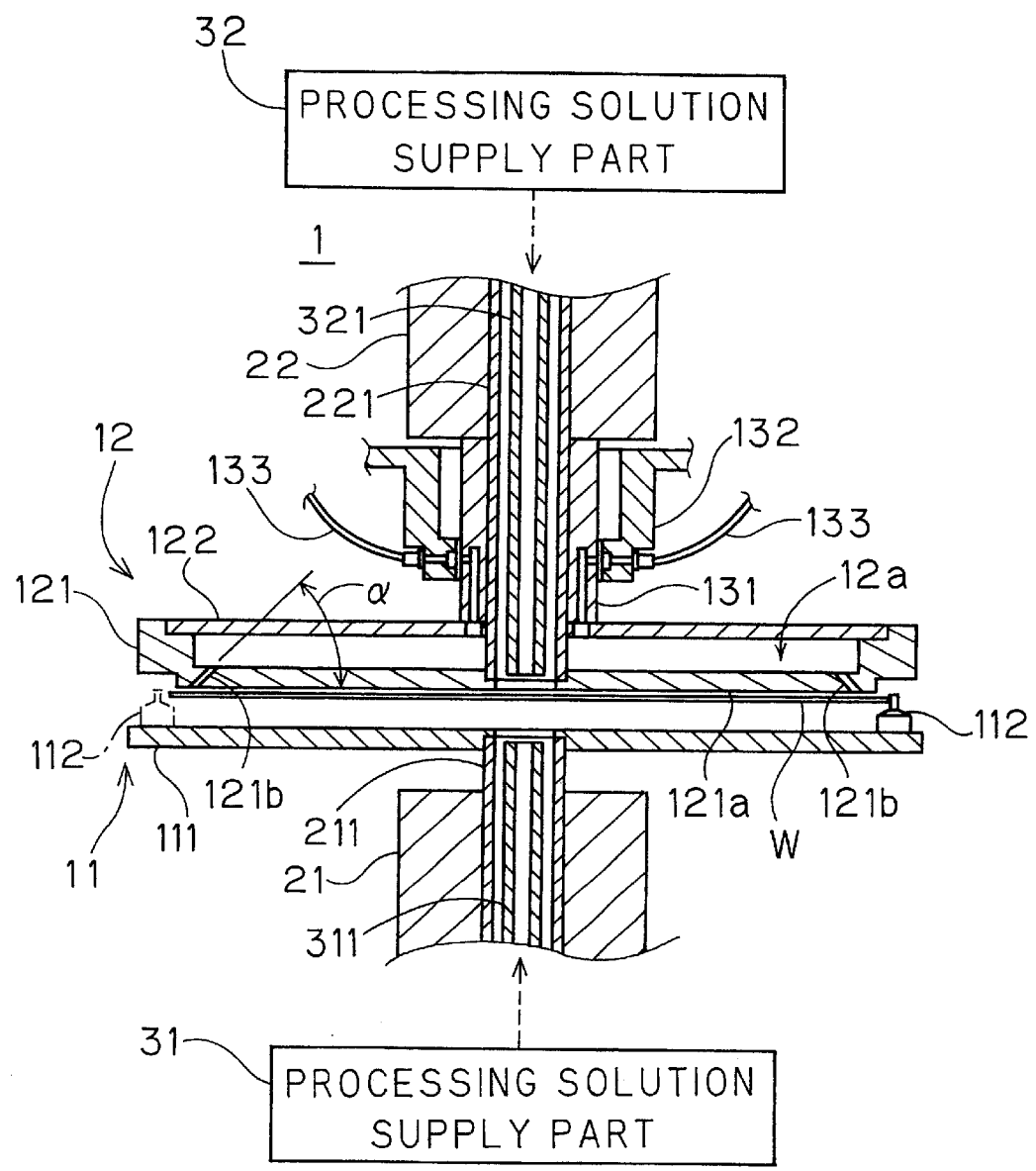
FIG. 4 is a sectional view showing a principal structure of a substrate processing apparatus according to a second embodiment of the present invention.

A second embodiment of the present invention is now described. FIG. 4 is a sectional view showing a principal structure of a substrate processing apparatus 1 according to the second embodiment of the present invention. The substrate processing apparatus 1 rotates a substrate W in a plane parallel to its main surface and supplies a processing solution, thereby processing the surface of the substrate W. The substrate processing apparatus 1 can perform various processing including bevel etching on the lower surface of the substrate W, and is also enabled to process the upper surface of the substrate W.

Referring to FIG. 4, the substrate processing apparatus 1 processes the lower surface of the substrate W. The lower surface of the substrate W is opposed to a rotary base 11 rotating the substrate W, while the upper surface thereof is opposed to a shielding part 12. The substrate W is transferred onto the rotary base 11 while the shielding part 12 is retracted, and the shielding part 12 thereafter moves to approach to the substrate W for injecting inert gas such as nitrogen gas. The substrate W is supported in a state extremely approaching to the shielding plate 12 due to Bernoulli effect resulting from a flow of the inert gas. In other words, the shielding plate 12 serves as a support supporting the substrate W from above.

The rotary base 11 and the shielding part 12 are connected to rotary shafts 211 and 221 of motors 21 and 22 respectively. A supply pipe 311 serving as a passage for a processing solution supplied from a processing solution supply part 31 is arranged in the hollow rotary shaft 211 of the motor 21. Another supply pipe 321 serving as a passage for a processing solution supplied from another processing solution supply part 32 is arranged in the hollow rotary shaft 221 of the motor 22. In order to process the upper surface of the substrate W, the supply pipe 321 discharges the processing solution toward the upper surface of the substrate W.

In the rotary base 11, a plurality of pins 112 are arranged on a plate-type turntable 111 opposed to the lower surface of the substrate W along the outer periphery of the substrate W. Each pin 112, having a bar-shaped upper portion perpendicular to a shielding surface 121*a*, serves as a member coming into contact with the outer edge of the substrate W and restraining the range of horizontal movement of the substrate W. The shielding part 12 is formed by a shielding member 121 having the shielding surface 121*a* opposed to the upper surface of the substrate W and a lid member 122 covering the upper portion of the shielding member 121. The dish-shaped shielding member 121 is engaged with the lid member 122 thereby defining a space 12*a* in the shielding part 12.

A plurality of injection ports 121*b* extending toward the shielding surface 121*a* from the space 12*a* are formed on the lower portion of the shielding member 121 for forcefully injecting the inert gas supplied to the space 12*a* toward the substrate W. In other words, the space 12*a* partially forms a passage guiding the inert gas to the injection ports 121*b*.

A passage member 131 and a supply port 132 are provided on the upper portion of the shielding part 12 for supplying the inert gas to the space 12*a*, and the inert gas is supplied to the supply port 132 from a gas supply part through a tube 133. The passage member 131 is mounted on a rotary shaft 221, while the supply port 132 is mounted on a fixed position irrelevant to rotation of the rotary shaft 221. The support pot 132 covers the outer periphery of the passage member 131, and a small clearance is defined between the passage member 131 and the supply port 132. Due to this structure, the inert gas can be regularly supplied from the fixed supply port 132 toward a passage in the passage member 131 while rotating the rotary shaft 221 and the passage member 131.

Figure 5:
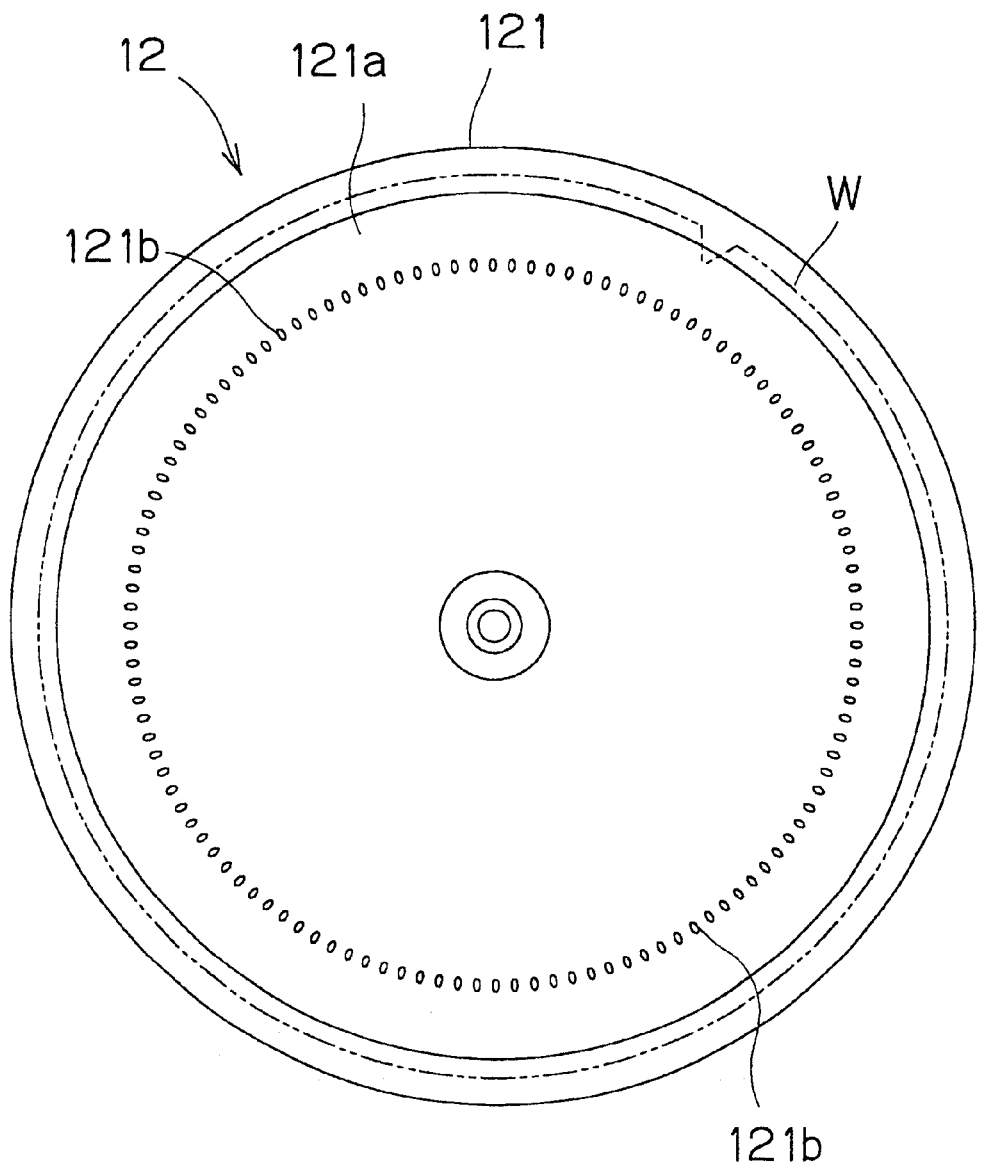
FIG. 5 illustrates the lower surface of a shielding member of the substrate processing apparatus shown in FIG. 4.

FIG. 5 shows the lower surface of the shielding member 121 (i.e., the lower surface of the shielding part 12). The large number of (preferably at least 30) small injection ports 121*b* are formed on the shielding surface 121*a* of the shielding member 121 along the peripheral edge of the substrate W. More specifically, the circular injection ports 121*b* having a diameter of about 0.3 to 1 mm in a section perpendicular to the direction of formation (extension) thereof are annularly formed at regular intervals within the range of 1 to 6 mm. The direction of the injection ports 121*b* is inclined toward the outer edge of the substrate W (see FIG. 4). Preferably, the injection ports 121*b* are formed in the range of an angle α of 20° to 40° with respect to the shielding surface 121*a*. Thus, the inert gas is forcefully injected from the injection ports 121*b* so that the substrate W is supported from above due to Bernoulli effect in a state separated from the shielding surface 121*a* by about 0.1 mm.

The large number of small injection ports 121*b* are formed oppositely to the peripheral edge of the substrate W at regular intervals, whereby a flow of the inert gas can be homogeneously formed on the peripheral edge of the substrate W at a high speed while suppressing consumption of the inert gas also when the substrate W is large-sized, for implementing stable support of the substrate W.

The shielding member 121 is integrally molded by resin having corrosion resistance against the processing solution. Preferably, the shielding member 121 is integrally molded by PVC (polyvinyl chloride), hard fluorocarbon resin such as PCTFE (polychlorotrifluoroethylene) or PEEK (poly (etheretherketone)) having higher mechanical strength than fluorocarbon resin. The injection ports 121*b* may be formed in this integral molding, or may be formed with a drill on the prototype of the shielding member 121. According to either method, the shielding member 121 can be readily prepared with precise injection ports 121*b*. Consequently, the throughput can be improved and stabilized while reducing the cost for manufacturing the substrate processing apparatus 1.

Figure 6:
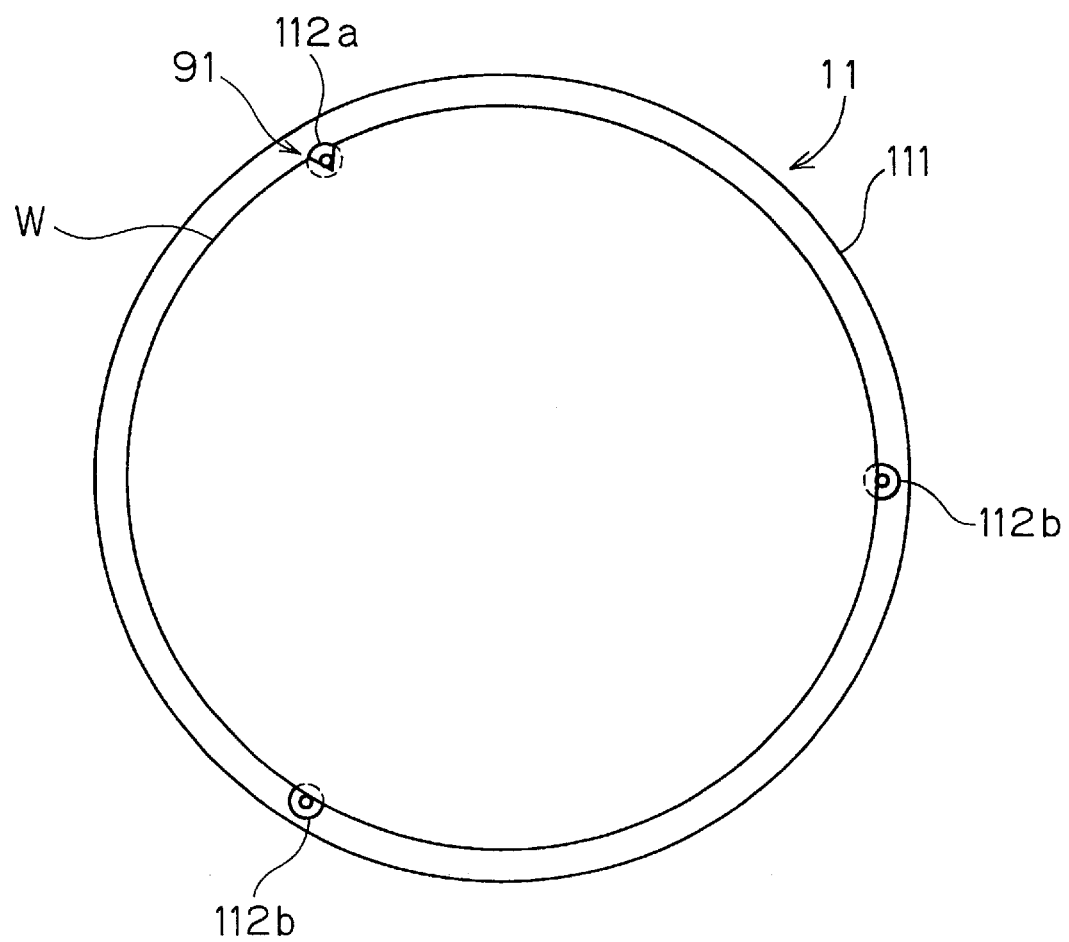
FIG. 6 illustrates a rotary base and a substrate as viewed from the shielding member of the substrate processing apparatus shown in FIG. 4.

FIG. 6 shows the rotary base 11 and the substrate W as viewed from the shielding part 12. Three pins 112*a* and 112*b* are mounted on the turntable 111 so that the pin 112*a* is located in a notch 91 of the substrate W and the remaining pins 112*b* are in proximity to the outer edge of the substrate W. In the following description, theses pins 112*a* and 112*b* may also be generically referred to as "pins 112".

The three pins 112 are so arranged as not to firmly hold the substrate W to fix the position thereof but to define a clearance between any of the pins 112 and the outer edge of the substrate W (to provide the so-called backlash). In other words, the pins 112 are so arranged that the substrate W is slightly horizontally movable between the pins 112. Therefore, the substrate W can be inserted between the three pins 112 fixed to the turntable 111.

On the other hand, the clearance between any pin 112 and the substrate W is set to restrain rotation of the substrate W. In other words, the intervals between the three pins 112 are so set as not to disengage the pin 112a from the notch 91. When the three pins 112 start rotating in a plane parallel to the shielding surface 121a along with the turntable 111, therefore, the pin 112a comes into contact with the notch 91 while either one of the remaining pins 112b comes into contact with the outer edge of the substrate W, which in turn is rotated in the plane parallel to the main surface. At this time, a clearance is defined between the other pin 112b and the substrate W. Thus, the substrate processing apparatus 1 can readily rotate the substantially circular substrate W through the notch 91 without firmly holding the same.

When the rotating speed of the turntable 111 is decelerated, the pin 112b having been separated from the substrate W comes into contact with the substrate W, while the pin 112b having been in contact with the substrate W is separated from the substrate W. The contact position of the pin 112a received in the notch 91 depends on whether the rotating speed is accelerated or decelerated.

When processing the lower surface of the substrate W as shown in FIG. 4, the substrate processing apparatus 1 supports the substrate W in a state not in contact with the shielding part 12 due to Bernoulli effect resulting from injection of the inert gas while limiting the horizontal position of the substrate W through the pins 112. The substrate W supported by the shielding part 12 due to rotation of the rotary base 11 driven by the motor 21 is rotated in contact with any of the pins 112. At this time, the supply pipe 311 closer to the rotary base 11 discharges the processing solution toward the lower surface of the substrate W, thereby processing the lower and side surfaces of the substrate W as well as portions slightly reaching the upper surface from the side surfaces.

The substrate W, supported through Bernoulli effect without being held by the pins 112 of the rotary base 11, is rotated along the shielding surface 121a of the shielding part 12 even if a slight error takes place in parallelism between the shielding surface 121a and the turntable 111 or the shielding surface 121a is slightly vertically moved. Therefore, the substrate W is not in contact with the shielding surface 121a. The pins 112 rotating the substrate W are merely fixed to the turntable 111.

Consequently, the substrate W and the shielding surface 121a can be stably approached to each other with an interval of up to about 0.1 mm due to an extremely simplified structure, so that atmosphere control (including prevention of penetration of particles) on the upper surface of the substrate W can be properly performed while the processing solution scattered from the substrate W is reliably prevented from adhering to the upper surface of the substrate W after being splashed back in the substrate processing apparatus 1.

When the substrate W is rotated, the motor 22 rotates the shielding part 12 substantially in association with the rotation of the substrate W. Thus, no speed difference is caused between the upper surface of the substrate W and the shielding surface 121a, for preventing the space between the substrate W and the shielding surface 121a from drawing the outside air.

When the lower surface of the substrate W is subjected to cleaning (by bevel etching, for example), the substrate W comes into contact with and separates from each pin 112 while slightly vertically moving with respect to the pins 112 during the processing, and hence the space between the substrate W and the pins 112 can be cleaned with no specific mechanism (such as a mechanism for moving the pins 112, for example). In other words, the substrate W can be prevented from leaving an uncleaned part thereon or contaminating a subsequent substrate W through a mechanical chuck transporting the substrate W with no specific mechanism.

Further, the substrate processing apparatus 1 having the aforementioned simplified structure can also implement reduction of the manufacturing cost as well as the footprint.

Figure 7:
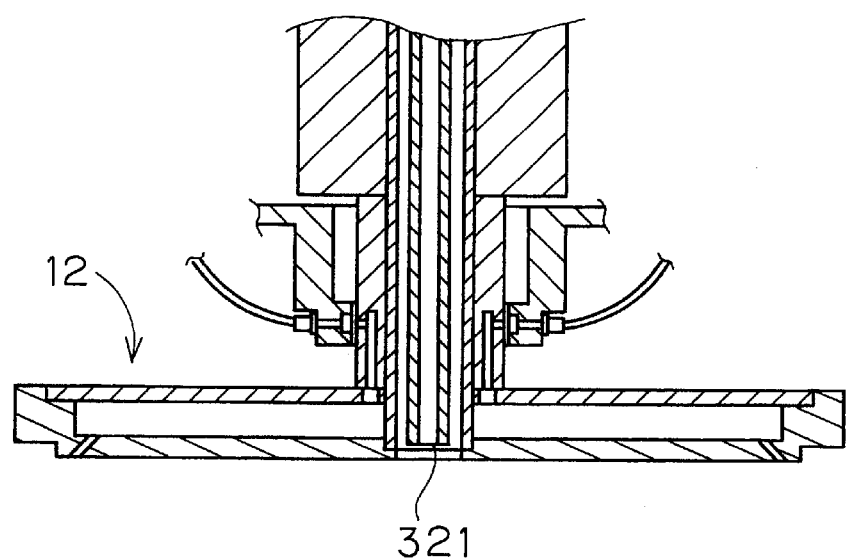
FIG. 7 is a sectional view showing the substrate processing apparatus processing the upper surface of the substrate.
Figure 7:
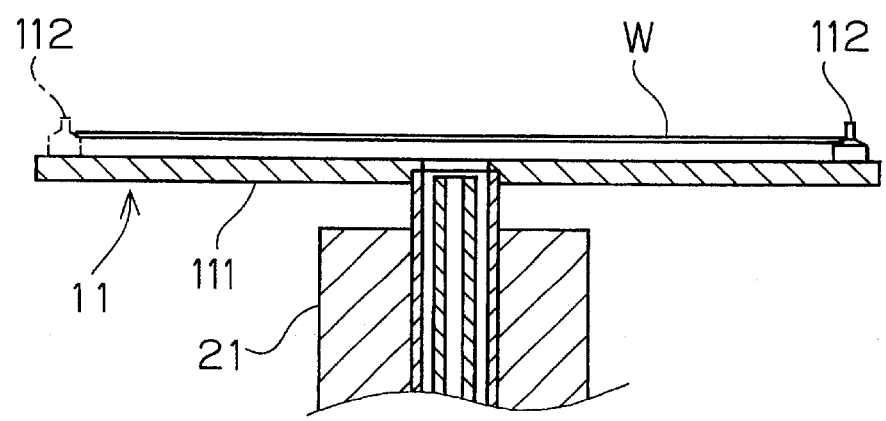

FIG. 7 is a sectional view showing the substrate processing apparatus 1 processing the upper surface of the substrate W after processing the lower surface thereof.

Figure 8:
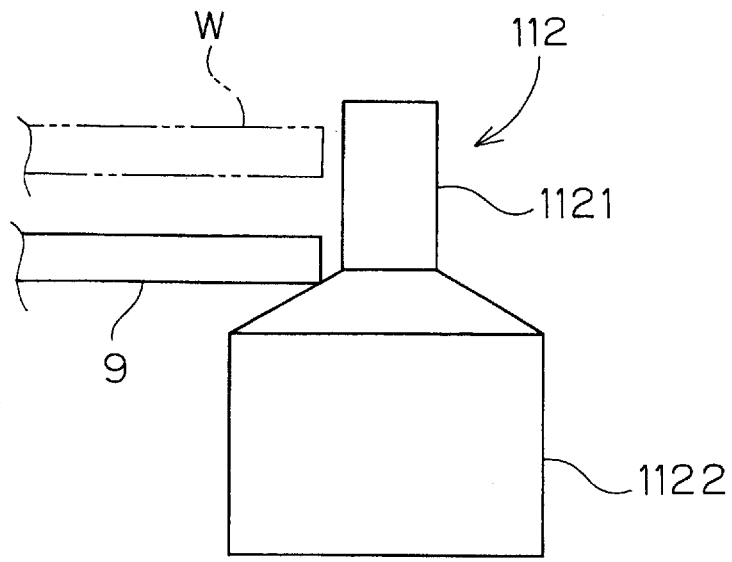
FIG. 8 illustrates a pin.

When processing the upper surface of the substrate W, the substrate processing apparatus 1 stops supplying the inert gas to the shielding part 12 in the state shown in FIG. 4, so that the substrate W falls toward the turntable 111. FIG. 8 shows the shape of each pin 112. The pin 112 is provided with upper and lower portions formed by a contact part 1121 having a small diameter and a support part 1122 having a large diameter respectively. In other words, the pin 112 is the so-called two-stage pin.

The contact part 1121 comes into contact with the outer edge of the substrate W supported by the shielding part 12, for rotating the substrate W. When the substrate W is released from support by the shielding part 12 and falls from a position shown by two-dot chain lines to a position shown by solid lines in FIG. 8, the support part 1122 comes into contact with the substrate W and supports the same from below. The pin 112 is thus formed by a two-stage pin thereby rotating the substrate W for processing the lower surface and supporting the same for processing the upper surface thereof through a simple structure.

When the support part 1122 of the pin 112 supports the substrate W, the shielding part 12 is separated from the substrate W as shown in FIG. 7, and the supply pipe 321 closer to the shielding part 12 supplies the processing solution toward the upper surface of the substrate W. Thereafter the motor 21 is driven to rotate the substrate W at a high speed along with the rotary base 11, thereby processing the surface of the substrate W.

As hereinabove described, the pins 112 having the support parts 1122 are arranged on the rotary base 11 and the supply pipes 311 and 321 can discharge the processing solution in the substrate processing apparatus 1, whereby the substrate processing apparatus 1 can process not only the lower surface but also the upper surface of the substrate W.

While the substrate processing apparatus 1 according to the second embodiment of the present invention has been described, the present invention is not restricted to the aforementioned embodiment but various modifications are also available.

While the substrate processing apparatus 1 processes a semiconductor substrate in the aforementioned embodiment, the object of processing may alternatively be a glass substrate for a flat panel display such as a liquid crystal display or a plasma display.

Figure 9:
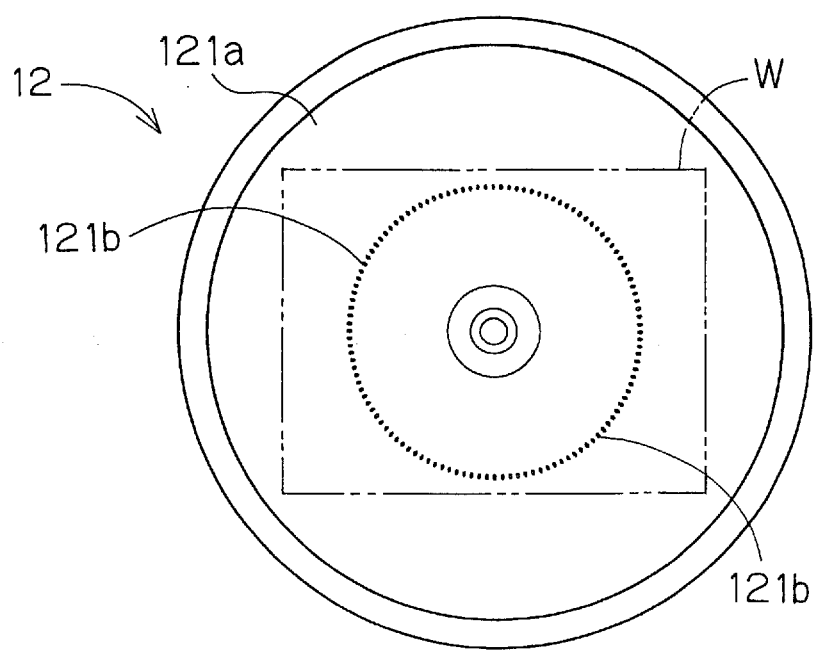
FIG. 9 illustrates another exemplary structure of the shielding part.
Figure 10:
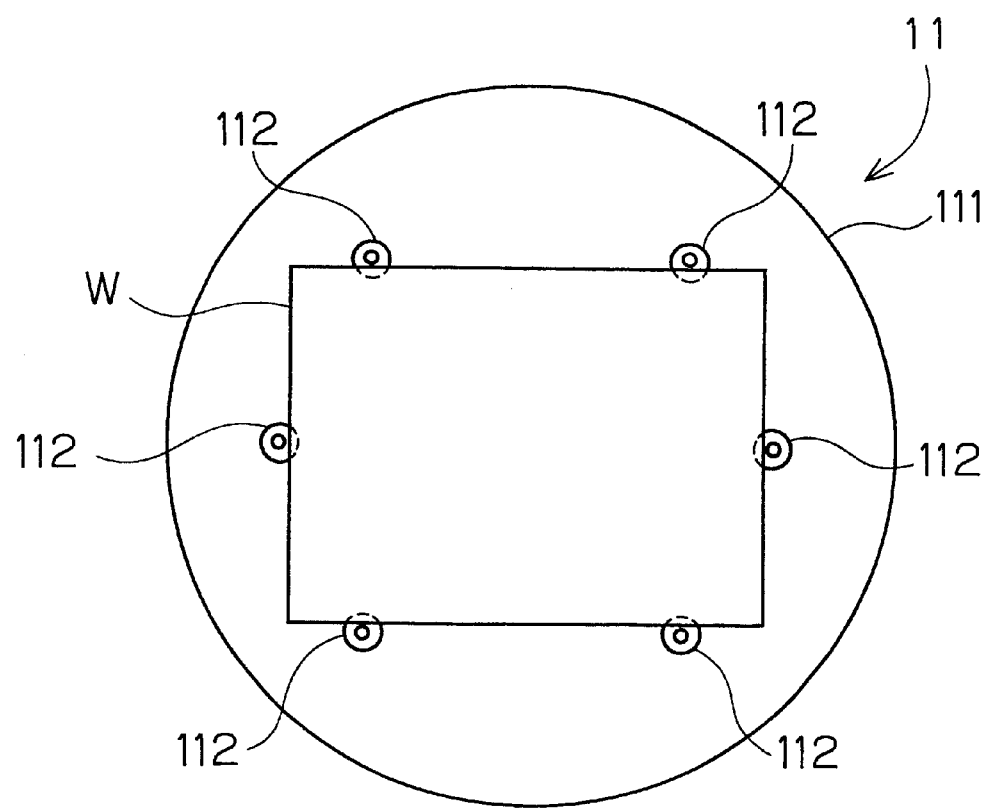
FIG. 10 illustrates another exemplary structure of the rotary base.

FIG. 9 illustrates the structure of a shielding part 12 for processing a rectangular substrate W such as a glass substrate, and FIG. 10 illustrates the structure of a rotary base 11. In order to handle the rectangular substrate W as shown in FIG. 9, a large number of injection ports 121b are annularly formed in a region covered with the substrate W in a shielding surface 121a, in order to cause Bernoulli effect on the overall peripheral edge of the substrate W even if the rotary base 11 and the shielding part 12 cannot be synchronously rotated. If the rotary base 11 and the shielding part 12 can be completely synchronously rotated, the injection ports 121b are preferably rectangularly arranged along the outer periphery of the substrate W, as a matter of course.

On the other hand, six pins 112 are arranged on a turntable 111 of the rotary base 11, as shown in FIG. 10. These pins 112 are so arranged as not to firmly hold the substrate W but to define a small clearance between the same and the substrate W, similarly to those for the substantially circular substrate W. Thus, when the substrate W is rotated, the pins 112 come into contact with or separate from the outer edge of the substrate W for allowing proper processing between the pins 112 and the substrate W.

As shown in FIG. 10, it is not necessary to bring any pin 112 into contact with the substrate W from a direction substantially perpendicular to the peripheral direction (the direction of rotation) in order to rotate the substrate W. The plurality of pins 112 at least partially come into contact with the substrate W to cause force having a peripheral component for rotating the substrate W. In other words, the substrate W is brought into a non-fixed state while the plurality of pins 112 at least partially come into contact with the substrate W substantially along the peripheral direction of the substrate W, thereby rotating the substrate W due to Bernoulli effect.

While the pins 112 are provided on the rotary base 11 in the aforementioned embodiment, the pins 112 may alternatively be provided on the shielding part 12. In this case, the shielding part 12 and the substrate W can be completely synchronously rotated.

Figure 11:
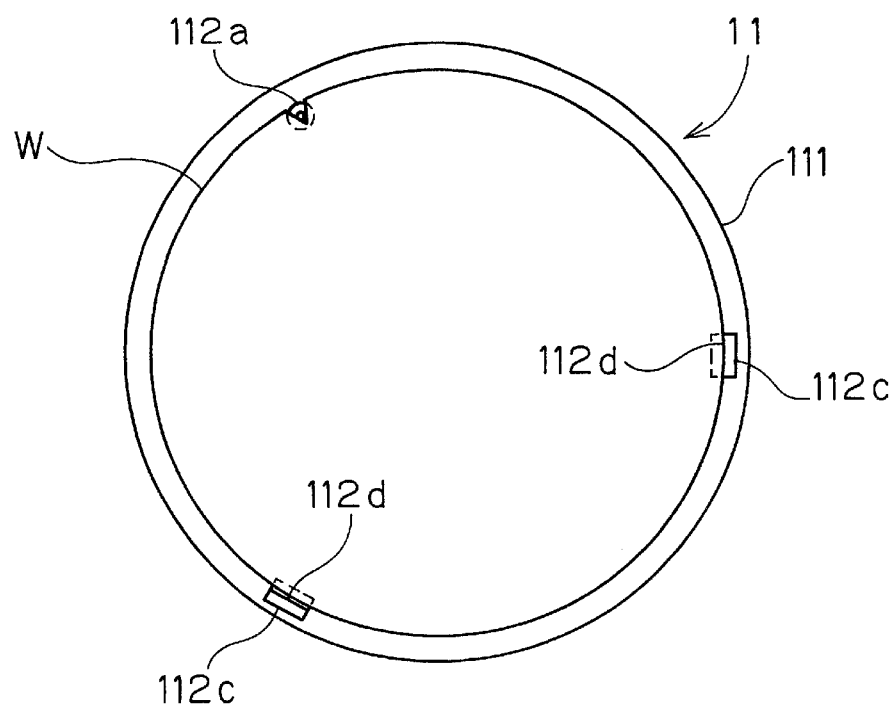
FIG. 11 is a diagram for illustrating another exemplary shape of the pin.

The pins 112, preferably in the form of bars in view of easiness in working and simplification of the structure, are not restricted to the bar form but may be in any form. For example, each pin 112c may bring a plane 112d into contact with the outer edge of a circular substrate W, as shown in FIG. 11. The pin 112c shown in FIG. 11 has an L-shaped longitudinal section, so that the lower portion of the pin 112c comes into contact with and supports the substrate W from below when processing the upper surface thereof.

Figure 12:
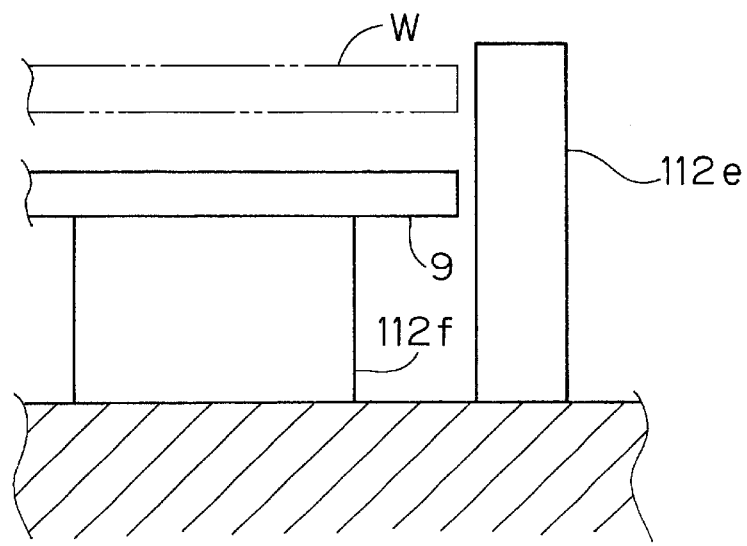
FIG. 12 illustrates a support member.

Further, each pin 112 may not have a support part on its lower portion but a cylindrical pin 112e may be arranged while separately providing a support member 112f for supporting a substrate W from below, as shown in FIG. 12.

While the supply pipes 311 and 321 discharge the processing solution for supplying the same to the substrate W in the aforementioned embodiment, the processing solution may be supplied by any method. For example, a spray or a slit may be utilized.

While the injection ports 121b are preferably 0.3 to 1 mm in diameter in the aforementioned embodiment, a large-sized substrate of at least eight inches in diameter can be properly supported if the diameter of the injection ports 121b is not more than 2 mm. While the injection ports 121b can be readily formed with a drill to have a circular shape in a section perpendicular to the direction of formation thereof, the form of the injection ports 121b is not restricted to the circular one. For example, rectangular injection ports 121b can be readily integrally molded from corrosion-resistant resin through a mold. Also in this case, the maximum width of the injection ports 121b is set to not more than 2 mm in a section perpendicular to the direction of formation thereof, so that the substrate W can be properly supported.

While the intervals between the injection ports 121b are preferably 1 to 6 mm in the aforementioned embodiment, the substrate W can be properly supported when a condition of not more than 30 mm is satisfied in practice. The injection ports 121b may not be formed at regular intervals but the substrate W can be supported also when the injection ports 121b are not annularly arranged. In order to homogeneously attain Bernoulli effect on the peripheral edge of the substrate W, however, it is preferable to form the injection ports 121b at regular intervals along the peripheral edge of the substrate W, as a matter of course.

While the inert gas is injected from the position opposed to the peripheral edge of the substrate W in the aforementioned embodiment, the inert gas may also be injected from a position opposed to the center of the substrate W. Thus, deflection resulting in the central portion of a large-sized substrate can be controlled.

While the gas is injected from the injection ports 121b for attaining Bernoulli effect in the aforementioned embodiment, the gas may alternatively be injected from slit injection ports. In other words, the injection ports 121b may have an arbitrary form.

While the shielding part 12 injects the inert gas such as nitrogen gas to attain Bernoulli effect in the aforementioned embodiment, another inert gas or gas other than the inert gas may alternatively be employed.

While the substrate processing apparatus 1 according to the aforementioned embodiment brings any of the pin 112 into contact with the substrate W with backlash thereby rotating the substrate W, the substrate processing apparatus 1 may alternatively move the pins 112 for firmly holding the substrate W after supporting the same by Bernoulli effect. Further alternatively, the structure of the shielding part 12 serving as the support for the substrate W may be utilized for the rotary base 11.

Figure 13:
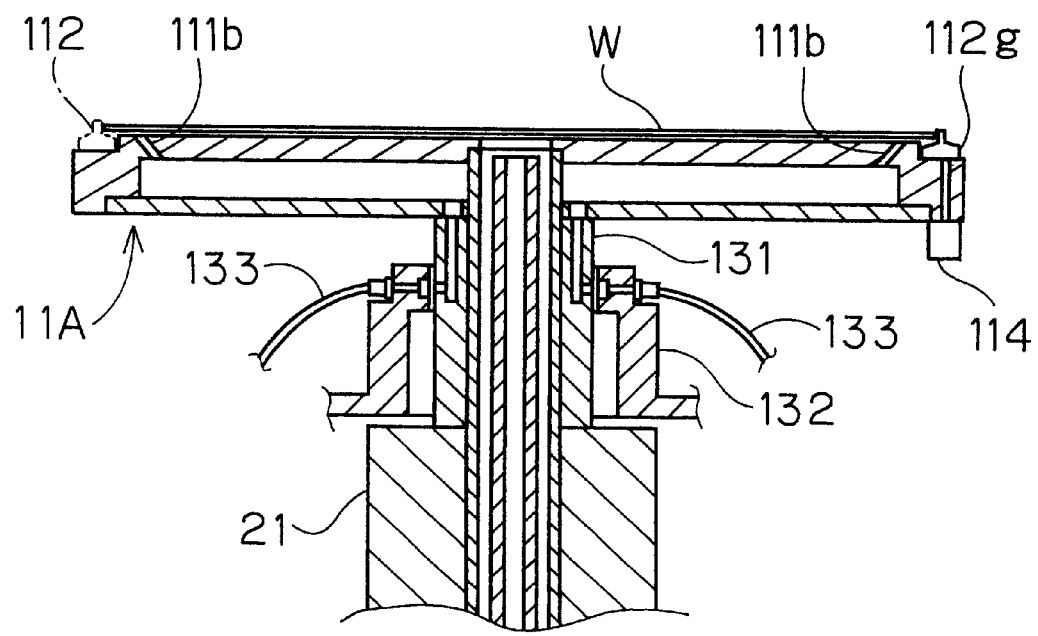
FIG. 13 is a sectional view of a rotary base.

FIG. 13 is a sectional view showing the structure of a rotary base 11A formed with a large number of injection ports 111b. The structure of the rotary base 11A is similar to that of the shielding part 12 shown in FIG. 4 except arrangement of pins 112. Inert gas is introduced into the rotary base 11A through a tube 133, a supply port 132 and a passage member 131 and guided to the injection ports 111b from a space in the rotary base 11A. Thus, a substrate W can be supported from below in a non-contact state due to Bernoulli effect. A pin 112g shown in FIG. 13 is eccentrically rotated by a motor 114 so that the plurality of pins 112 including the pin 112g firmly hold the substrate W supported by Bernoulli effect. Also when supporting the substrate W from below, it is possible to rotate the substrate W without firmly holding the same, similarly to FIG. 4.

The technique of supporting a substrate through Bernoulli effect attained by a large number of small injection ports may be utilized for another application in any of various types of substrate processing apparatuses, as a matter of course. For example, a structure similar to the shielding part 12 may be utilized as a support in a transport mechanism transporting the substrate W to the rotary base 11. Thus, the support having the large number of small injection ports may be provided in arbitrary relation with the remaining structures for processing the substrate W.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus supplying a processing solution to a substrate for performing prescribed processing, comprising:

a rotary base member, having a support member substantially horizontally supporting said substrate, rotatably supported about a vertical axis, said support member engaging with said substrate for preventing said substrate from horizontal movement and rotation with respect to said rotary base member while allowing vertical movement of said substrate;

a rotating/driving part rotating said rotary base member;

a processing solution supply part supplying said processing solution to a lower surface of said substrate supported and rotated on said rotary base member; and a proximity suction member provided above said rotary base member, downwardly and outwardly injecting gas from a support surface of said proximity suction member to toward the overall peripheral edge of an upper surface of said substrate supported by said support member Bernoulli effect, said support surface being a lower surface of said proximity suction member located on a plane substantially parallel to said substrate on said rotary base member.

2. The substrate processing apparatus according to claim 1, wherein
said support member comprises:
a regulation part engaging with the peripheral edge of said substrate for regulating horizontal movement of said substrate and rotation of said substrate with respect to said rotary base member, and
a support part mounted on said rotary base member for vertically movably supporting said regulation part.

3. A substrate processing apparatus supplying a processing solution to a substrate for performing prescribed processing, comprising:
a proximity suction member downwardly and outwardly injecting gas from a support surface of said proximity suction member toward the overall peripheral edge of an upper surface of said substrate for sucking said substrate to said support surface in a non-contact and a proximity state by the Bernoulli effect;
a rotating/driving part rotating said susbstrate sucked by said proximity suction member in the proximity state; and
a processing solution supply part supplying said processing solution to a lower surface of said substrate rotated in the state sucked by said proximity suction member in the proximity state.

4. The substrate processing apparatus according to claim 3, further comprising a rotary base member approaching to said lower surface of said substrate to sandwich said substrate between the same and said proximity suction member for atmospherically blocking said lower surface of said substrate.

5. The substrate processing apparatus according to claim 4, wherein
said proximity suction member comprises:
a plurality of holes formed in said support surface for injecting gas, said plurality of holes each having the maximum width of not more than 2 mm in a section perpendicular to the direction of formation of said holes; and
a passage guiding said gas to said plurality of holes.

6. The substrate processing apparatus according to claim 5, wherein
each of said plurality of holes is circular in said section perpendicular to the direction of formation of said holes.

7. The substrate processing apparatus according to claim 6, wherein
said support surface is a surface on a single member.

8. The substrate processing apparatus according to claim 7, wherein
said plurality of holes are formed along the peripheral edge of sucked/supported said substrate.

9. The substrate processing apparatus according to claim 8, wherein
said plurality of holes are formed at intervals of not more than 30 mm.

10. The substrate processing apparatus according to claim 4, further comprising a plurality of contact members arranges on the outer periphery of said substrate sucked by said proximity suction member in the proximity state, wherein
said rotating/driving part rotates said plurality of contact members in a plane parallel to said a support surface of said proximity suction member injecting said gas thereby sucking said substrate through the Bernoulli effect, for at least partially bringing said plurality of contact members into contact with said substrate substantially in the peripheral direction thereof and rotating said substrate.

11. The substrate processing apparatus according to claim 10, wherein
said plurality of contact members at least partially come into contact with a notch formed on said substrate.

12. The substrate processing apparatus according to claim 11, wherein
said plurality of contact members are fixed onto said rotary base member.

13. The substrate processing apparatus according to claim 12, wherein
said plurality of contact members are bar members perpendicular to said support surface.

14. The substrate processing apparatus according to claim 13, further comprising:
a contact support part coming into contact with and supporting said substrate from below when said substrate is released from suction by said proximity suction member; and
an upper processing solution supply part supplying said processing solution to said upper surface of said substrate.

15. The substrate processing apparatus according to claim 14, wherein
said contact support part is lower portions of said plurality of contact members.

* * * * *